United States Patent [19]

Maxwell

[11] Patent Number: 4,698,024
[45] Date of Patent: Oct. 6, 1987

[54] RACK FOR INPUT/OUTPUT MODULES FOR A PROGRAMMABLE CONTROLLER

[75] Inventor: James W. Maxwell, Johnson City, Tenn.

[73] Assignee: Texas Instrument Incorporated, Dallas, Tex.

[21] Appl. No.: 353,766

[22] Filed: Mar. 1, 1982

[51] Int. Cl.⁴ .................. H01R 9/09; H01R 13/629
[52] U.S. Cl. ........................ 439/62; 439/160; 439/377; 361/399
[58] Field of Search ............... 339/45 R, 45 M, 45 T, 339/17 LM, 17 M, 91 R, 65; 361/346, 353, 380, 393, 395, 399

[56] References Cited

U.S. PATENT DOCUMENTS

| | | | |
|---|---|---|---|
| 2,717,339 | 9/1955 | Brown | 361/353 |
| 2,914,708 | 11/1959 | Edmunds | 361/353 |
| 3,736,471 | 5/1973 | Donze et al. | 339/17 LM |
| 3,784,954 | 1/1974 | Grimm et al. | 339/17 LM |
| 3,853,379 | 12/1974 | Goodman et al. | 339/65 |
| 3,932,016 | 1/1976 | Ammenhauser | 339/65 |
| 4,241,966 | 12/1980 | Gomez | 339/45 M |
| 4,296,454 | 10/1981 | Wong | 361/380 |
| 4,298,905 | 11/1981 | Bosler et al. | 361/393 |
| 4,341,428 | 7/1982 | Hatch et al. | 339/91 R |
| 4,469,388 | 9/1984 | Narozny | 339/45 M |

*Primary Examiner*—Eugene F. Desmond
*Assistant Examiner*—Gary F. Paumen
*Attorney, Agent, or Firm*—James P. McAndrews; John A. Haug; Melvin Sharp

[57] ABSTRACT

A rack for use in mounting a plurality of input/output modules in a programmable controller or process control computer system or the like has a plurality of first connectors mounted on a circuit board for making detachable electrical connection to the respective modules and has second connector means for connecting the circuit board to the controller system. A rack member molded of a stiffly resilient insulating material has a bottom with apertures therein mounted over the circuit board to permit access to the first connectors and has a pair of juxtaposed integral side walls upstanding from the bottom of the rack to engage respective opposite lateral edges of the modules to guide the modules into respective first connectors in compact side-by-side relation to each other within the rack member. A plurality of latch elements are detachably mounted on the side walls of the rack member so that pairs of the elements are pivoted into latching engagement with respective opposite lateral edges of each individual module as it is inserted into the rack member for holding the module firmly in electrical connection with a first connector, the pair of latch elements being positioned to be manually moved when desired for ejecting individual modules from the rack member.

8 Claims, 8 Drawing Figures

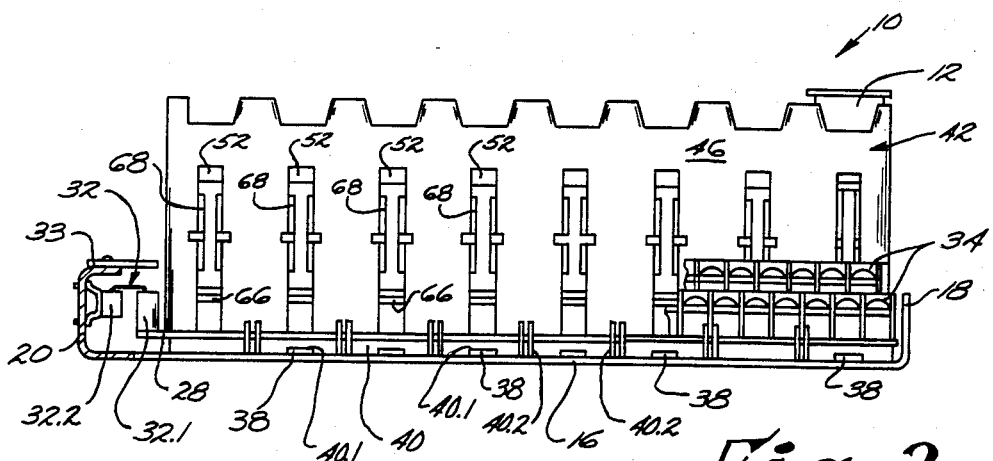
Fig. 2.
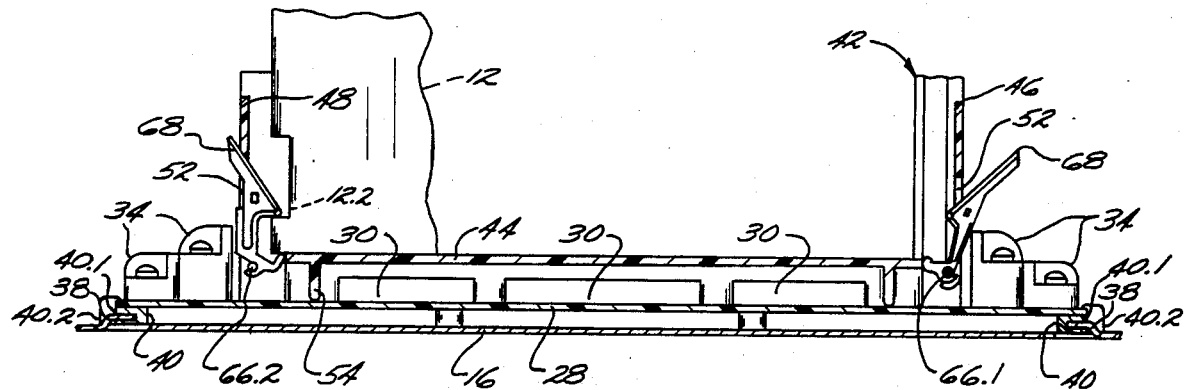
Fig. 3.
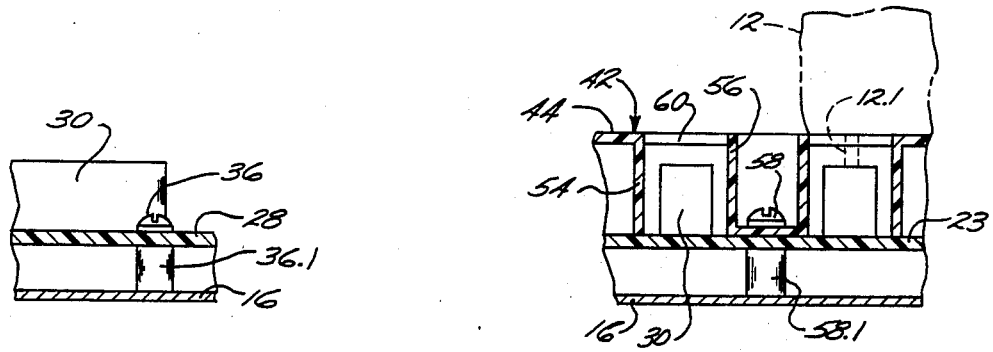
Fig. 4.
Fig. 5.

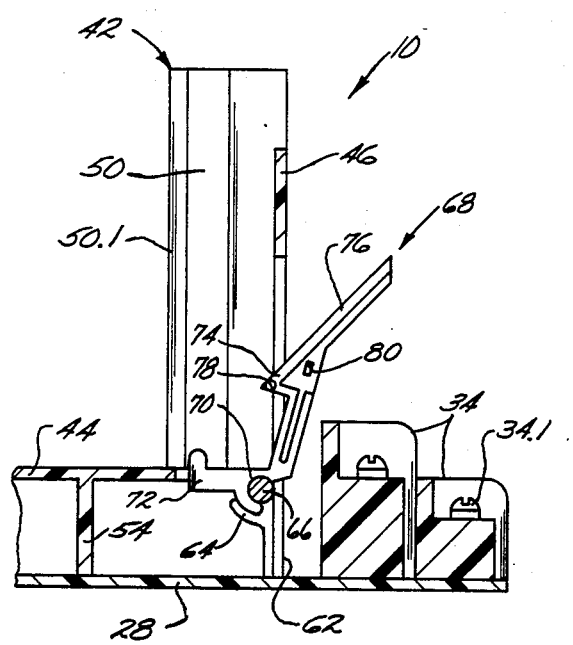
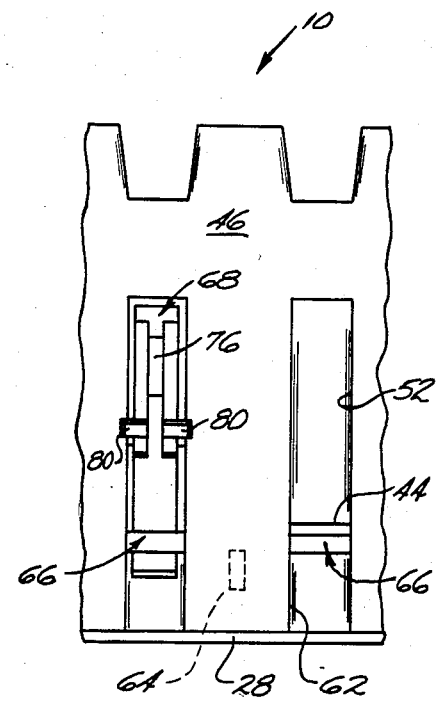
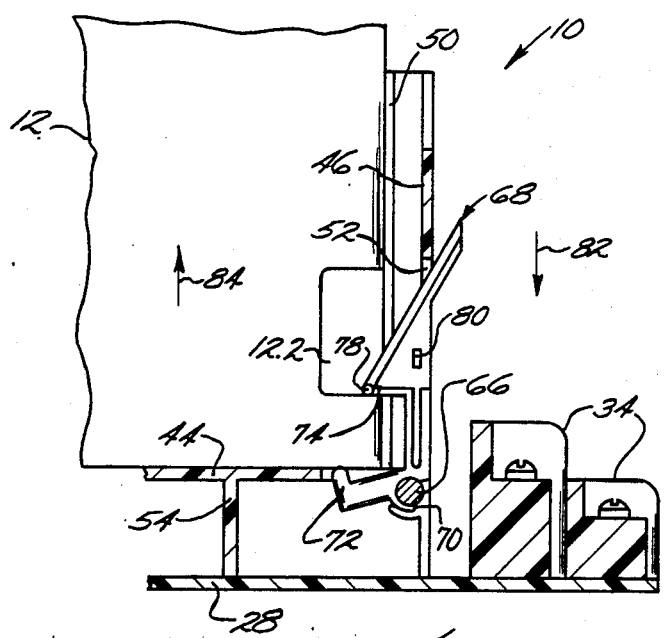

RACK FOR INPUT/OUTPUT MODULES FOR A PROGRAMMABLE CONTROLLER

BACKGROUND OF THE INVENTION

The field of this invention is that of electronic equipment utilizing detachable electronic modules and the invention relates more particularly to racks for mounting a plurality of such modules on programmable electronic controller or process control computer systems or the like.

As the use of programmable electronic controllers and process control computers rapidly increases, it is becoming more and more common to have a substantial number of base controller units dispersed at a variety of locations around a factory and to have such base controllers coupled to a common sequencer or central processing unit. In that arrangement, it is desirable to have racks available at each of the base controller locations for use in mounting a plurality of input/output modules in detachable electrical connection with the individual base controllers. For that purpose, it is highly desirable to provide conveniently useable module racks which can be made available in substantial number at low cost but which are also adapted to provide secure and reliable mounting for the modules. The reliable mounting of the modules becomes particularly important where the modules are provided in the form of long or wide but thin packets to better accommodate module components and the like. As thus far made available, mounting racks for input/output modules for programmable controllers and the like have tended to be either expensive and somewhat inconvenient to use or to provide less than fully secure module mounting, particularly for large flat modules.

SUMMARY OF THE INVENTION

It is an object of this invention to provide a novel and improved rack for use in mounting a plurality of electronic modules in detachable electrical connection with an electronic equipment; to provide such a rack which is adapted to mount a plurality of modules in compact side-by-side relation to each other while also providing secure and reliable mounting for each of the individual modules; to provide such a rack which is characterized by low cost, light weight, convenient use, and by rugged and long lasting construction.

Briefly described, the novel and improved module mounting rack of this invention comprises circuit means such as a printed circuit or wiring board mounted on a suitable base. A plurality of first connectors are mounted on the circuit board for detachably electrically connecting the respective electronic modules to the circuit board and a second connector means is also provided on the circuit board for connecting the board to a programmable controller or other electronic equipment. Conventional means are provided on the base for physically mounting the rack relative to the electronic equipment. Typically for example, the first connectors comprise conventional edgeboard connectors adapted to receive and make electrical connection to terminals provided on the edges of circuit boards incorporated in the individual electronic modules. The second connector typically comprises a flexible ribbon connector or the like extending from an edge of the circuit board to make electrical connection to the electronic equipment. In a preferred embodiment, conventional barrier strip units are mounted along two edges of the circuit board for use in making electrical connection between the circuit board and various sensors or other input devices and between the circuit board and process control components or other output devices in conventional manner. The first connectors are then arranged on the circuit board in rows between the barrier strips. Conventional bayonet or screw means or the like are used for physically mounting the rack.

In accordance with this invention, a guide means is mounted on the base over the circuit board for receiving and engaging opposite lateral edges of the individual electronic modules to guide the modules in compact side-by-side relation to each other in detachable electrical connection with respective first connectors on the circuit board. A plurality of latch means are pivotly mounted on the guide means and are arranged so that, as each individual module is inserted into the guide means and is guided by engagement of the lateral edges of the module with guides, a first end of the module engages a pair of the latch means and pivots the latch means as the module is moved into detachable electrical connection with its respective first connector, whereby the latch means also move into releasable latching engagement with the respective opposite lateral edges of the module and hold the module firmly in its detachable electrical connection.

Preferably for example, the guide means comprises a rack member molded of a stiffly resilient electrically insulating material or the like. The rack has a bottom open to permit access to the first connectors on the circuit board and has a pair of intergral side walls upstanding from the rack bottom in relation to each other to engage respective opposite lateral edges of electronic modules inserted between the side walls. The side walls each have pairs of guides spaced along the length of the side wall for engaging individual modules at the lateral edges of the modules as the modules are inserted into the rack member. The side walls also have openings located between the pairs of guides. The rack member has pivot means provided adjacent each of the side wall openings, and the latch means each comprise latch elements fitted into the respective side wall openings in the rack member. Each latch element is preferably molded of a stiffly resilient organic material and has a pivot surface to engage pivot means on the rack member, has a lever to engage a module being inserted into the rack member for pivoting the latch element, and has a latch arm to make releasable latching engagement with the module when the latch element is pivoted.

DESCRIPTION OF THE DRAWINGS

Other objects, advantages and details of the novel and improved input/output module mounting rack of this invention appear in the following detailed description of the preferred embodiment of the invention, the detailed description referring to the drawings in which:

FIG. 2 is a side elevation view of the rack shown in FIG. 1, the side elevation view also being partly cut away to facilitate illustration of the rack;

FIG. 3 is a section view along line 3—3 of FIG. 1;

FIG. 4 is a partial section view to enlarged scale along the line 4—4 of FIG. 1;

FIG. 5 is a partial section view to enlarged scale along line 5—5 of FIG. 1;

FIG. 6 is an enlarged partial section view similar to FIG. 3 illustrating one position of the latch means used in the rack of this invention;

FIG. 7 is a partial side elevation view of the latch means illustrated in FIG. 6; and FIG. 8 is a partial section view corresponding to FIG. 6 illustrating an alternate position of the latch means shown in FIG. 6.

DESCRIPTION OF THE PREFERRED EMBODIMENTS

Figure 1:
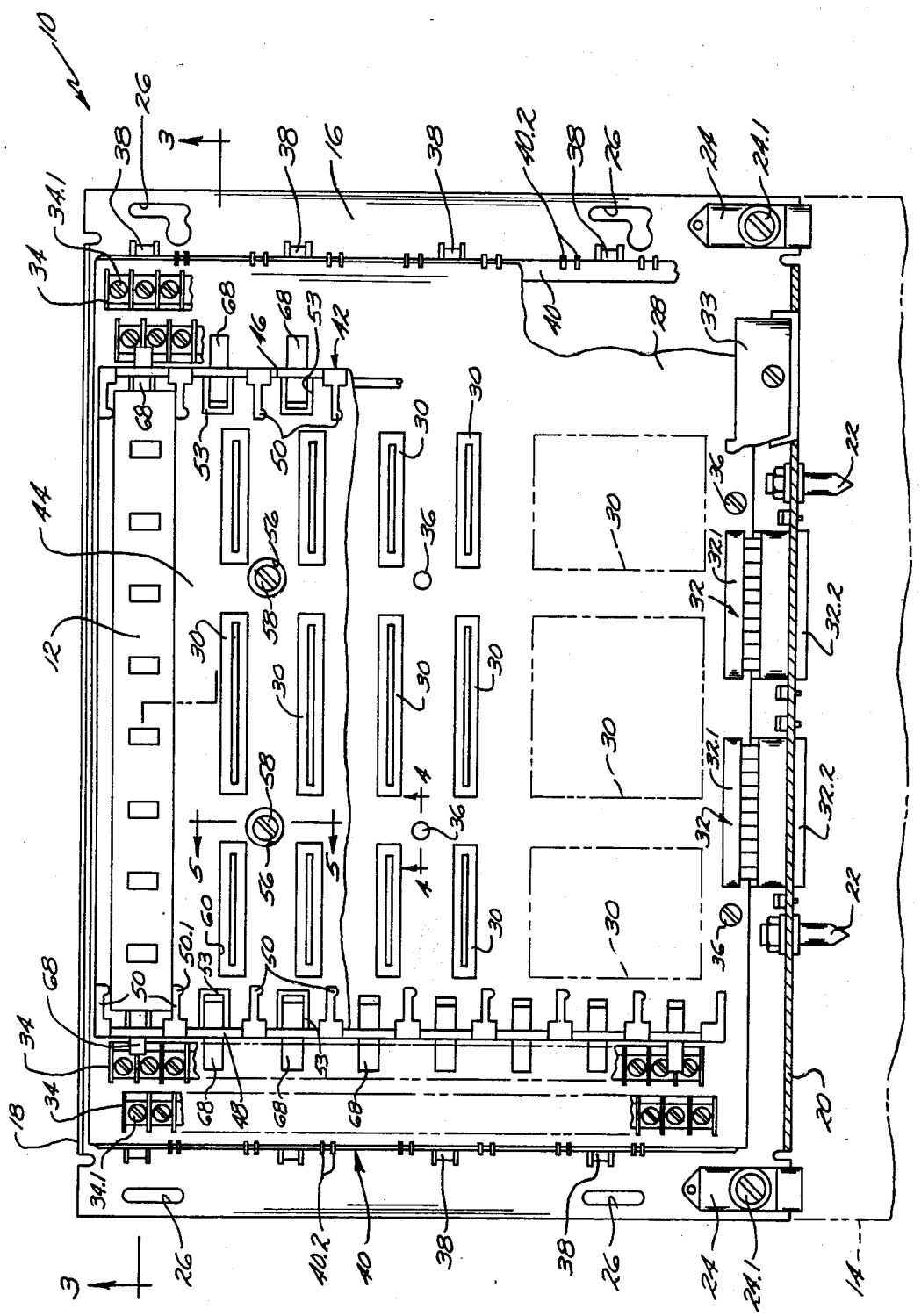
FIG. 1 is a plan view of the rack of this invention illustrating several components of the rack cut away to facilitate illustration of the rack.

Referring to the drawings, 10 in FIGS. 1-8 indicates the novel and improved rack provided by this invention for use in detachably electrically connecting a plurality of electronic modules 12 to an electronic equipment as diagrammatically illustrated in FIG. 1 by the broken lines 14. Typically for example, the electronic equipment 14 comprises a base controller unit of a programmable controller system or the like and the electronic modules 12 comprise input or output modules such as are conventionally used in such controller systems. However, the rack 10 is also adapted for use in mounting other modules on other electronic equipment within the scope of this invention.

As shown particularly in FIGS. 1-3, the rack 10 includes a base 16 formed of a generally flat sheet metal material having a strengthening rib 18 upstanding from a sheet at the back end of the rack and having a rib or flange 20 upstanding from the sheet at the front of the rack for strengthening the rack and for mounting means for use in connecting the rack to the equipment 14. Preferably for example, the base has bayonet means 22 mounted on the base flange, has bayonet receptibles 24 mounted on the base sheet itself, and has screw openings 26 provided in the base sheet. The bayonets and bayonet receptibles are aligned and interfitted with corresponding components (not shown) on the equipment 14 for aligning and physically attaching the rack 10 to the equipment 14 in conventional manner as will be understood and screw means 24.1 as well as other screw means (not shown) fitted in the openings 26 served to securely position the rack relative to the equipment.

In accordance with this invention, a conventional printed circuit or wiring board 28 is mounted on the base 16, a plurality of first connector means 30 are mounted on the base for detachably electrically connecting a plurality of the electronic modules 12 to circuit means (not shown) provided on the circuit board, and second connector means 32 are provided on the circuit board for electrically connecting the circuit board to corresponding circuit means (not shown) in equipment 14.

Preferably, one or more barrier strip units 34 are mounted on the circuit board 28 in electrically connected relation to selected circuit path means on the board by soldering or the like in conventional manner, whereby a plurality of sensors or other input devices (not shown) are adapted to be electrically connected to some connectors 34.1 on the strips and a plurality of process control components of the like (not shown) are adapted to be connected to other connections 34.1 to be electrically connected to the equipment 14 via the circuit board 28 in a conventional manner. A plurality of edgeboard connectors 30 are then mounted in rows on the board and are electrically connected to circuit paths on the board in conventional manner. If desired as shown in FIG. 1, two or more of the rows of the connectors 30 may be arranged to make detachable electrical connection to the modules 12. The second connector means 32 then preferably comprise a pair of ribbon connectors connected at one end 32.1 to circuit paths on the board and having their opposite ends 32.2 mounted on the base flange 20 for making electrical connection between the circuit paths of the board and the equipment 14 as will be understood. Preferably the circuit board 28 is secured to the base by screws 36 using stand-offs 36.1 (see FIGS. 4-5 and, in the preferred embodiment of this invention, bosses 38 are formed by knock-outs in the base sheet 16 which are raised up from the base to hold molded board supports 40, each of the supports having a plurality of openings 40.1 into which end of the bosses 38 are fitted as shown in FIG. 3 for positiong the supports on the base sheet the supports 40 each having a plurality of detents 40.2 molded into the support and fitted over the edge of the circuit board 28 for holding the circuit board edges against vibration or the like. Preferably a cover plate 33 is attached to the base flange 20 to extend over the connectors 32.

In accordance with this invention, the rack 10 further includes guide means which are mounted on the base 16 over the circuit board 28 for receiving and engaging the individual electronic modules 12 as they are inserted into the rack 10 to guide the modules at the respective opposite latteral edges of the modules into compact side-by-side relation to each other within the rack in detachable electrical connection with the respective first connectors 30. The rack also includes a plurality of latch means which are pivotably mounted on the guide means to be engaged and pivoted by first ends of the modules being inserted into the rack for moving the latch means into releasable latching engagement with said opposite latteral edges of the modules as the modules are moved into said electrical connection. In that way, the latch means serve to firmly hold the modules in said detachable electrical connection.

In accordance with this invention, the guide means preferably comprises a rack member 42 which is preferably molded in one unit of a strong and stiffly resilient, electrically insulating material such as polycarbonate or the like to have a bottom 44 and to have a pair of integral side walls 46, 48 which stand up from the bottom in spaced juxtaposed relation to each other. The side walls each have pairs of guides 50 spaced along the length of the side wall and each have openings 52 which are located between respective pairs of the guides. Clearance holes 53 are preferably provided in the rack bottom adjacent each of the side wall openings 52. (See FIGS. 6-8) The bottom of the rack member is preferably provided with ribs 54 which are molded to extend down from the rack bottom to engage the circuit board 28 between the connectors 30 for strengthening the rack and for positioning the rack in a standoff position over the circuit board 28. (See FIG. 5). The rack member also has bosses 56 molded into the bottom for use with mounting screws 58 and with stand-offs 58.1 in securing the rack to the base 16 (See FIG. 6). The bottom of the rack member is then provided with apertures 60 which align with the connectors 30 on the circuit board and permit access to the individual connectors 30 as will be understood. (See FIG. 5). Preferably a flange 62 is molded into the rack bottom around the periphery of the rack and bosses 64 are integrally formed in that flange and steel pivot rod means 66 are mounted on the member by being press fitted between those bosses and the member bottom 44. Preferably for example, the rod means 66 is provided in a U-shape and the opposite legs 66.1 and 66.2 of that shape are snapped over the bosses as illustrated in FIG. 3 so that the pivot means 66 are provided adjacent to each of the rack side wall openings 52. Preferably as shown in FIG. 1, each of the guides 50 has a tip 50.1 of reduced size to facilitate reception of a module 12 between a pair of the guides.

In accordance with this invention, each of the latch means preferably comprises a latch element 68 which is molded of a strong and stiffly resilient material such as glass filled nylon or the like so that the element has a pivot surface 70, a lever 72, a latch arm 74 and a control arm 76. Preferably the latch element also has a first pair of detents 78 molded therein at opposite sides of the element, preferably at the end of the latch arm or nose 74 as shown in FIGS. 6-8, and has a second pair of detents 80 preferably molded on the control arm of the element.

In that arrangement, the latch elements 68 are releasably fitted into the respective side wall openings 52 in the rack member to rest the pivot surface 70 of the latch to bear against a portion of the pivot rod 66 located adjacent to the side wall opening as shown in FIGS. 6-8. The latch element is releasably positioned in its opening in that the detents 78 are inserted into the opening 52 with a twist or with sufficient force to snap through the opening in the resilient side wall material, the detents extending relatively wider than the opening 52 so that the latch element is thereby retained in the opening until withdrawn with deliberate force.

Accordingly, when a module 12 is inserted into the rack member 42, a pair of guides 50 on each side wall 46, 48 engage the module at the latteral edges thereof and guide the modules so that circuit boards 12.1 or other connectors on the modules are detachably electrically connected to the respective edgeboard connectors 30 or the like on the circuit board. (See FIG. 5). As the module is moved into its electrical connection to the connector 30, the module engages the levers 72 of a pair of the latch elements and pivots the elements so that the latch arms 74 of the elements snap over detents 12.2 or the like provided on the module at respective opposite latteral edges of the module, thereby to firmly hold the module in its detachable connection to the connector 30. As the latch elements are thus pivoted, the control arms of the latch elements are drawn in closer to the rack and the second set of detents 80 snap into the side wall opening 52 to releasably retain the control arm in its withdrawn position. However, the control arm remains accessible in the opening to be manually moved down when desired as indicated by the arrow 82 in FIG. 8 so that lever 72 of the latch element lifts the module 12 in the direction indicated by the arrow 84 in FIG. 8 in that way, the latch elements release their latching engagement with the module 12 and serve to eject the module from the rack 42.

As thus described, the rack 10 of this invention is shown to comprise simple and inexpensive components which are adapted to be readily assembled to form the rack units. The rack is adapted to accommodate a large number of electronic modules in compact side-by-side relation to each other and provides guidance as the modules are inserted into the rack for assuring that each module is precisely connected to electrical connector means provided on the circuit board in the rack. Latch means are positioned to engage each of the modules along the latteral edges thereof as the modules are individually inserted into the rack. Therefore, the latch elements provide secure mounting for each of the individual elements whether the rack is full or whether individual modules have been removed from the rack. The rack is characterized by its low cost construction even though it is adapted to provide secure and reliable mounting of the electronic modules.

It should be understood that although particular embodiments of the invention have been provided by way of illustrating the invention, this invention includes all modifications and equivalents of the invention as set forth in the appended claims.

I claim:

1. A rack for use in detachably electrically connecting a plurality of electronic modules to an electronic equipment, the rack comprising circuit means, a plurality of first connector means for use in detachably, electrically connecting individual modules to the circuit means, second connector means for use in electrically connecting the circuit means to the electronic equipment, guide means for receiving and guiding the individual electronic modules into detachable electrical connection with the respective first connector means, the guide means having means adapted to receive respective modules which are inserted into the rack and to engage the modules at the lateral edges thereof for guiding the modules into compact side-by-side relation to each other as the modules are inserted into the guide means, and a plurality of pairs of latch means pivotally mounted with the latch means of each pair being arranged to be engaged by a first end of an electronic module being inserted in the guide means as the module is detachably electrically connected to a respective first connector means for pivoting the latch means of the pair into latching engagement with the module at respective lateral edges thereof to releasably hold the module firmly in said electrically connected relation to said first connector means, characterized in that the guide means comprises a rack member having a bottom open to permit access to said first connector means and having a pair of side walls upstanding from the bottom in juxtaposed relation to each other to engage respective lateral edges of the modules inserted therebetween, the side walls have guides spaced therealong to engage and guide individual electronic modules into detachable electrical connection with the respective first connector means and have openings between respective pairs of the guides, pivot means are provided on the rack member at each of the side wall openings, and the latch means each comprise a separate latch element having a lever portion, a latch arm portion and a pivot surface portion, the latch elements being releasably fitted into the respective side wall openings in the rack member to releasably position the pivot surface portion thereof to bear releasably against the pivot means on the rack member, to dispose the lever of the element to engage the first end of the selected module being inserted into the guide means to pivot the element against said pivot means on the rack member to be held against the pivot means by the module, and to move the latch arm of the element into latching engagement with the inserted module as the element is pivoted for detachably latching the module in the rack member.

2. A rack as set forth in claim 1 further characterized in that each latch element has a control arm which extends from a side wall opening in the rack member when the latch arm of the element releasably engages a module inserted into the guide means so that the control arm is adapted to be manually moved for pivoting the latch element oppositely to release latching engagement with the module and to move the lever of the element to eject the module from the guide means and from its detachable electrical connection with a first connector means.

3. A rack as set forth in claim 2 further characterized in that each latch element has first detent means thereon to releasably engage the rack member at opposite sides of a rack member side wall opening when the latch element is fitted into said opening for releasably retaining the element in the opening.

4. A rack as set forth in claim 3 further characterized in that each latch element has second detent means thereon to releasably engage the rack member at opposite sides of a rack member side wall opening when the latch element is fitted into said opening and is in releasably latching engagement with a module inserted into the guide means, the second detent means serving to retard initial manual movement of the control arm of the latch element to avoid inadvertent movement of the latch element.

5. A rack for use in detachably electrically connecting a plurality of electronic modules to an electronic equipment comprising a base, circuit board means having circuit path means thereon mounted on the base, a plurality of first connector means mounted on the circuit board means for use in detachably electrically connecting individual electronic modules to the circuit path means, second connector means provided on the circuit board means for use in electrically connecting the circuit path means to an electronic equipment, a rack member of a stiffly resilient electrically insulating material having a bottom mounted on the base over the circuit board means and having apertures thereon permitting access to the first connector means on the circuit board means, the rack member having a pair of integral side walls upstanding from the bottom in spaced juxtaposed relation to each other to engage respective lateral edges of individual modules which are mounted on the rack by being inserted between said side walls, the side walls have guides spaced therealong so that a pair of guides on each side wall engages each individual module inserted into the rack member at the respective opposite lateral edges of the module to guide the modules into compact side-by-side relation to each other within the rack member in detachable electrical connection with respective first connector means on the circuit board, the side walls having an opening therein between each of said pairs of guides, pivot means provided on the rack member adjacent each of said openings, and a plurality of latch elements each having a lever, a latch arm, a control arm and a pivot surface releasably positioned in the respective side wall openings, each latch element being arranged in an opening to dispose its pivot surface to bear releasably against said pivot means on the rack member adjacent the opening, to dispose its lever to be engaged by a first end of a module being guided into the rack member by the guides at either side of the opening for pivoting the element against said pivot means as the module is detachably connected to a first connector means on the circuit board means to releasably engage the latch arm in latching engagement with the module as the element is pivoted for firmly holding the module in said detachable electrical connection, and to position the control arm to be manually moved when desired for rejecting the module from the rack member.

6. A rack as set forth in claim 5 further characterized in that a first pair of detents extend laterally from respective opposite sides of the latch element to pass through an opening in the resilient rack member side wall when the latch element is fitted into the opening from releasably retaining pivot surface of the latch element against the pivot means on the rack member.

7. A rack as set forth in claim 6 further characterized in that the second pair of detents extend laterally from the respective opposite sides of the latch element to pass through an opening in the resilient rack member side wall as the latch element is pivoted into latching engagement with a module for releasably retaining the control arm of the element in a position to be manually moved when desired for ejecting the module from the rack member.

8. A rack as set forth in claim 5 further characterized in that the rack member has integral standoff means thereon engaging the circuit board means to position the bottom of the rack member over the circuit board means and has integral bosses formed on the rack member adjacent the member side wall openings, and pivot rods are fitted into the bosses to provide said pivot means on the rack member adjacent to the openings.

* * * * *